US009787261B2

(12) United States Patent
Lesso et al.

(10) Patent No.: US 9,787,261 B2
(45) Date of Patent: Oct. 10, 2017

(54) CLASS-D AMPLIFIER CIRCUITS

(71) Applicant: Cirrus Logic International Semiconductor Ltd., Edinburgh (GB)

(72) Inventors: John P. Lesso, Edinburgh (GB); Toru Ido, Kanagawa (JP)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/278,862

(22) Filed: Sep. 28, 2016

(65) Prior Publication Data

US 2017/0019079 A1    Jan. 19, 2017

Related U.S. Application Data

(63) Continuation of application No. 14/521,191, filed on Oct. 22, 2014, now Pat. No. 9,473,087.

(30) Foreign Application Priority Data

Oct. 23, 2013  (GB) .................................. 1318745.5

(51) Int. Cl.
*H03F 3/38* (2006.01)
*H03F 3/217* (2006.01)
(Continued)

(52) U.S. Cl.
CPC ......... *H03F 3/2171* (2013.01); *H03F 1/0211* (2013.01); *H03F 3/187* (2013.01);
(Continued)

(58) Field of Classification Search
CPC ........ H03F 3/68; H03F 3/2171; H03F 3/2173; H03F 2200/331
(Continued)

(56) References Cited

U.S. PATENT DOCUMENTS 6,791,405 B2   9/2004  Tsuji et al.
6,812,785 B2  11/2004  Masuda et al.
(Continued)

FOREIGN PATENT DOCUMENTS

GB  2 431 531 A    4/2007
JP  6-303049 A    10/1994
JP  2004072707 A   3/2004

OTHER PUBLICATIONS

Maxim Integrated Products Inc., Class D Amplifiers: Fundamentals of Operation and Recent Developments, Application Note 3977: Jan. 31, 2007.

*Primary Examiner* — Steven J Mottola
*Assistant Examiner* — Hafizur Rahman
(74) *Attorney, Agent, or Firm* — Blank Rome LLP

(57) ABSTRACT

Methods and apparatus for Class-D amplifier circuits with improved power efficiency. The circuit has an output stage with at least first and second switches and a modulator that receives an input signal to be amplified, $S_{IN}$, and a first clock signal $f_{SW}$. The modulator controls the duty cycles of the first and second switches, within a switching cycle based on the input signal, wherein the switching cycle has a switching frequency based on the first clock signal. A frequency controller controls the frequency of the first clock signal in response to an indication of the amplitude of the input signal so as to provide a first switching frequency at a first input signal amplitude and a second, lower, switching frequency at a second, lower, input signal amplitude. A lower switching frequency can be tolerated at low signal amplitudes and varying the switching frequency in this way thus maintains stability while reducing switching power losses.

20 Claims, 7 Drawing Sheets

(51) Int. Cl.
  *H03F 1/02*    (2006.01)
  *H03F 3/187*   (2006.01)
  *H03G 1/00*    (2006.01)

(52) U.S. Cl.
  CPC ........... *H03F 3/217* (2013.01); *H03G 1/0088* (2013.01); *H03F 2200/165* (2013.01); *H03F 2200/171* (2013.01); *H03F 2200/333* (2013.01); *H03F 2200/351* (2013.01)

(58) Field of Classification Search
  USPC .............. 330/10, 207 A, 251; 327/131–137; 347/9; 381/120; 375/328
  See application file for complete search history.

(56) References Cited

U.S. PATENT DOCUMENTS

| | | |
|---|---|---|
| 7,161,510 B2 | 1/2007 | Sugiyama |
| 8,093,951 B1 | 1/2012 | Zhang et al. |
| 8,376,486 B2 | 2/2013 | Ide et al. |
| 2007/0242777 A1 | 10/2007 | Suzuki |
| 2013/0163789 A1 | 6/2013 | Maeno et al. |
| 2015/0054577 A1* | 2/2015 | Yuan .................. H03F 3/2175 330/10 |
| 2015/0288335 A1* | 10/2015 | Hoyerby ................ H03F 3/217 330/251 |

\* cited by examiner

CLASS-D AMPLIFIER CIRCUITS

This application is a continuation of U.S. patent application Ser. No. 14/521,191, filed Oct. 22, 2014, the entire disclosure of which is incorporated herein by reference.

BACKGROUND OF THE INVENTION

1. Field of the Invention

This invention relates to Class-D amplifier circuits, especially to Pulse-Width-Modulated or Sigma-Delta Class-D amplifiers, with circuitry for reducing power consumption, and in particular to Class-D audio amplifiers.

2. Description of the Related Art

FIG. 1 shows a basic arrangement of one example of a pulse-width-modulated (PWM) Class-D amplifier 100, sometimes referred to as a Sigma-Delta amplifier or switch-mode amplifier. An output stage 101 comprises at least two switches connected in series between two supplies, which may be, for example, a unipolar supply voltage Vdd and ground (GND) or could be bipolar positive and negative supply voltages.

The output node at the common node of the two series switches is switched between the power supplies to provide a rail-to-rail square wave output with a duty cycle controlled to provide the desired output voltage. In some embodiments the output stage may be connected to a passive reactive smoothing filter 102 to provide low pass filtering of the output signal $V_{OUT}$ to a load 103. In some embodiments however the filter arrangement 102 may be omitted and the load 103 connected directly to the output stage, relying on inherent filtering in the load 103 itself.

The output stage 101 is controlled by a modulator 104 which receives the input signal $S_{IN}$ to be amplified and derives control signals for switching the output stage 101 in an appropriate switching cycle. In a PWM amplifier the output voltage may be fed back and compared/combined with the input signal $S_{IN}$ to derive an error signal. This error signal is passed through a loop filter 106 and then typically compared, by comparator 105, to a reference waveform to control the duty cycle of the output stage. Typically the reference waveform is a repeating ramped waveform such as a triangular or sawtooth type waveform. To provide the reference waveform a waveform generator 107 may receive a clock signal $F_{IN}$ at a switching frequency $f_{SW}$ which defines the ramp period. This clock signal $F_{IN}$ may also be used to reset the comparator 106. In such an arrangement the switching frequency $f_{SW}$ defines the overall switching cycle frequency of the output stage 101.

Such Class-D amplifiers can be ideally 100% efficient as the output is rail-to-rail and the filter 102, if present, contains only reactive components. In practice however there will be power losses, for example due to power consumption of the control circuitry, ohmic ($I^2R$) losses associated with the non-zero resistance of the switch elements and power consumed in driving the control nodes of the switch devices. There may also be losses due to any overlap in on-time of the practical switches allowing shoot through current or underlap, i.e. excessive deadtime, when both switches are off and recirculating inductive current flows through a body diode associated with a switch with a diode drop loss.

It will of course be appreciated that FIG. 1 illustrates only one example of a fairly simple arrangement and other more complex arrangements exist however the basic principles described apply generally to Class-D type amplifiers.

It would be desirable, especially for Class-D amplifiers used in battery powered devices such as portable electronic devices, to reduce power losses where possible.

SUMMARY OF THE INVENTION

Thus according to the present invention there is provided a Class-D amplifier circuit for amplifying an input signal comprising:

an output stage comprising at least first and second switches;

a modulator comprising a signal input for receiving the input signal and a clock input for receiving a first clock signal, the modulator being configured to control the duty cycles of the first and second switches within a switching cycle based on the input signal, wherein the switching cycle has a switching frequency based on the first clock signal; and a frequency controller for controlling the frequency of the first clock signal in response to an indication of the amplitude of the input signal so as to provide a first switching frequency at a first input signal amplitude and a second, lower, switching frequency at a second, lower, input signal amplitude.

The frequency controller may comprise a comparator for comparing the indication of signal amplitude to at least one threshold and the frequency controller may be configured to control the frequency of the clock signal based on said comparison. The frequency controller may be configured to provide the first switching frequency if the indication of signal amplitude is above a first threshold and to provide the second switching frequency if the indication of signal amplitude is below the first threshold. The first threshold may correspond, for example, to a substantially quiescent input signal amplitude or to a signal input amplitude which is within a set range, say within 5-25%, of the maximum signal amplitude. In some embodiments the comparator may be configured to compare the indication of signal amplitude to a plurality of different thresholds, with each threshold corresponding to a different switching frequency.

The indication of the amplitude of the input signal may be an envelope value for the input signal and the amplifier circuit may comprise an envelope detector for monitoring the input signal and deriving said envelope value. In some embodiments the indication of the amplitude of the input signal may be a received volume control signal.

in some embodiments the indication of the amplitude of the input signal may derived from the output of said comparator. The circuit may comprise a pulse width monitor for determining the pulse width or duty cycle of pulses output from the comparator, wherein the pulse width or duty cycle provides said indication of the amplitude of the input signal. The pulse width monitor may comprise a counter clocked by a second clock signal wherein the second clock signal has a greater frequency than said first clock signal.

The indication of the amplitude of the input signal may additionally or alternatively be derived from a control signal output from said modulator for controlling the switches of the output stage or derived from an output of the output stage.

The second switching frequency may be substantially half of the frequency of the first switching frequency.

The frequency controller may comprise a clock generator for receiving an input clock signal and generating at least one additional clock signal from the input clock signal. The clock generator may comprise a frequency divider or frequency multiplier for generating the additional clock signals from the input clock signal. The input clock signal may be used as a clock signal at one of the first or second switching frequencies. The clock generator may comprise a multiplexor configured to receive a clock signal at the first switching frequency at a first input and a clock signal at the second switching frequency at a second input, wherein the output of the multiplexer is switched between its inputs based on the indication of amplitude of the input signal. The multiplexer may be controlled so that any switching of the output of the multiplexor between its inputs is timed so as to be substantially synchronised to a clock edge of both of the first and second clock signals.

The modulator may comprise a reference waveform generator for generating a ramped reference waveform at a frequency based on the first clock signal. The frequency controller may be configured such that any change in switching frequency is substantially synchronised to the top or bottom of the ramp of the reference voltage waveform. The reference waveform generator may be configured such that the amplitude of the reference waveform is substantially the same at both the first and second switching frequencies. The clock generator may therefore be configured to generate a gain control signal indicating any changes in said switching frequency and the reference waveform generator may be configured to receive the gain control signal and adjust the slope of the ramp waveform based on the gain control signal to compensate for any change in switching frequency. In some embodiments the reference waveform generator may comprise an integrator circuit connected to at least first and second current steering branches, each current steering branch comprising at least one current source for generating a charging or discharging current based on the first clock signal. In some embodiments the second current steering branch can be enabled or disabled based on the gain control signal. Additionally or alternatively at least one current source may be programmable based on the gain control signal. In some embodiments the reference waveform generator may comprise an integrator circuit comprising an op-amp and a first feedback capacitor wherein at least one additional feedback capacitor can be selectively connected in parallel with first feedback capacitor based on said gain control signal.

The frequency controller may be configured to implement the transition from the first switching frequency to the second switching frequency or the second switching frequency to from the first switching frequency over a period of time. The transition may implemented by a series of steps of change in switching frequency and/or for at least part of the transition the frequency controller may be configured to apply a gradual rate of change of switching frequency at the beginning and end of the transition and an increased rate of change in the middle of the transition. The transition may have a sinusoidal rate of change of switching frequency with time. The frequency controller may thus comprise a frequency modulator for controllably varying the first clock signal between a plurality of predetermined switching frequencies with the modulator controlling the change between predetermined switching frequencies to approximate a smooth transition in switching frequency between said first and second switching frequencies. The frequency modulator may comprise a sigma-delta modulator. The period of time of the transition in switching frequency may be between 0.1-0.5 ms inclusive.

The class-D amplifier circuit may be implemented as an integrated circuit and/or may form part of a driver circuit. The driver circuit may be arranged to drive at least one of: an audio transducer, a haptic transducer, an ultrasound transducer; or an electromechanical actuator or motor. The amplifier circuit as described may be implemented in an electronic device, which may be at least one of: a portable device; a battery powered device; a mobile communications device; a computing device; a gaming device; an audio device; or an ultrasonic device.

In another aspect of the invention there is provided a method of amplifying an input signal in a Class-D amplifier comprising:
  receiving the input signal and a first clock signal;
  controlling the duty cycles of at least first and second switches of an output stage within a switching cycle based on the input signal, where the switching cycle has a switching frequency based on the first clock signal; and
  receiving an indication of the amplitude of the input signal; and
  varying the frequency of the first clock signal in response to the indication of the amplitude of the input signal so as to provide a first switching frequency at a first input signal amplitude and a second, lower, switching frequency at a second, lower, input signal amplitude.

The method of this aspect of the invention offers all of the same advantages and can be used with all of the variants as discussed above in relation to the first aspect of the invention.

In general, embodiments of the invention provide a Class-D amplifier circuit for amplifying a signal, the circuit comprising: an output stage; and a frequency controller for controlling the switching frequency of the output stage in response to an indication of the amplitude of the signal so as to provide a first switching frequency at a first signal amplitude and a second, lower, switching frequency at a second, lower, signal amplitude.

Also provided is a Class-D amplifier circuit comprising: an output stage; and a controller for controlling switching of the output stage to amplify an input signal wherein the controller is configured to switch the output stage with a first switching frequency at a first input signal amplitude and with a second, lower, switching frequency at a second, lower, input signal amplitude.

In another aspect there is a Class-D amplifier circuit comprising: an output stage; and a controller for controlling switching of said output stage to amplify an input signal wherein said controller is configured to reduce the switching frequency of the output stage for low amplitude input signals.

In a further aspect there is provided a Class-D amplifier circuit for amplifying an audio signal comprising: an output stage comprising at least first and second switches; a modulator comprising a signal input for receiving the audio signal and a clock input for receiving a first clock signal, the modulator being configured to control the duty cycles of the first and second switches based on said audio signal and a cyclic reference waveform, wherein the frequency of the cyclic reference waveform depends on the first clock signal; and a frequency controller for controlling the frequency of the first clock signal in response to an indication of the amplitude of the audio signal so as to provide a first frequency at a first audio signal amplitude and a second, lower, frequency at a second, lower, audio signal amplitude.

In a further aspect there is provided a Class-D amplifier circuit for amplifying an audio signal comprising: an output stage comprising at least first and second switches; a modulator comprising a signal input for receiving the audio signal and a clock input for receiving a first clock signal at a first clock frequency, the modulator being configured to generate a cyclic reference waveform at a frequency dependent on the first clock frequency and control the duty cycle, per cycle of said cyclic reference waveform, of the first and second switches based on said audio signal and the cyclic reference waveform, and a frequency controller for controlling the frequency of the first clock signal in response to an indication of the amplitude of the audio signal so as to provide a first frequency at a first audio signal amplitude and a second, lower, frequency at a second, lower, audio signal amplitude.

BRIEF DESCRIPTION OF THE DRAWINGS

The invention will now be described by way of example only with respect to the following drawings, of which.

DETAILED DESCRIPTION OF THE PREFERRED EMBODIMENTS

Figure 1:
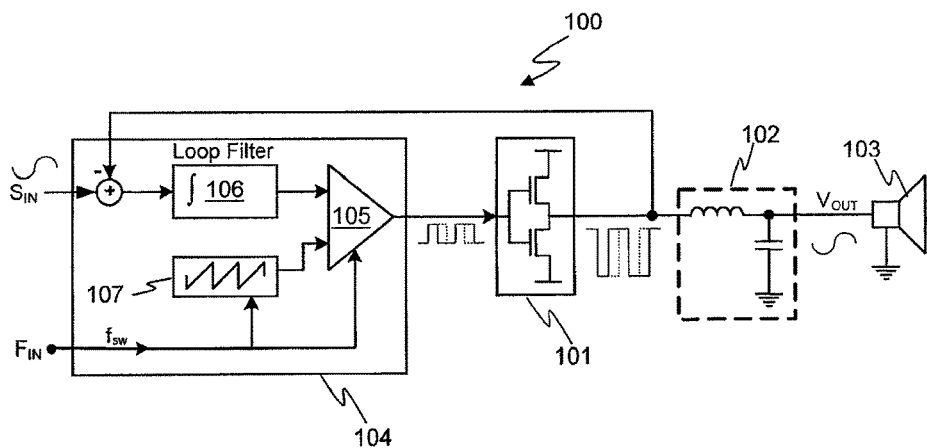
FIG. 1 illustrates a basic Class-D amplifier.

As described above FIG. 1 illustrates the basic principles of a Class-D type amplifier. Such an amplifier can be relatively power efficient compared to Class A or Class AB amplifiers but a practical Class-D amplifier will still suffer from power losses which it may be desirable to reduce where possible.

For audio applications it has been appreciated that audio waveforms tend to have a high crest factor, i.e. the ratio of peak signal level to average r.m.s. signal level. Also it may be rare for an audio amplifier to be used at the maximum power, i.e. volume, setting. Thus, for audio applications, the power consumption at low to medium output power levels of a Class-D amplifier is important in determining the average overall power consumption of the amplifier in use.

One of the main contributions to power consumption at such low output power levels is typically the power consumption in driving the switches of the output stage, e.g. the charging ("$CV^2$") losses associated with driving the gate capacitance C of a MOSFET switch through a voltage V. These power losses occur every switching cycle and so are related to the switching frequency (f), i.e. the losses are proportional to $fCV^2$. A lower switching frequency would therefore result in lower switching losses than a higher switching frequency. In addition other power losses may also be related to switching frequency, for example any losses due to shoot-through current may occur each switching cycle and thus may be lower at lower switching frequencies. It may therefore be beneficial to use a relatively low switching frequency. However the minimum switching frequency is determined by performance and stability considerations.

In theory a Class-D amplifier could be implemented in an open-loop configuration with a pulse width being derived which is proportional to the input signal value rather than an error signal. However the use of practical components with non-ideal switch resistances, charge injection etc. could result in errors in the transfer function leading to distortion in the output signal. The negative feedback loop suppresses these distortion components by a factor equal to the open-loop gain at the relevant frequencies.

The overall open-loop gain $A_u$ depends on various factors such as the loop filter response, the conversion factor from the loop filter output to the duty cycle of the pulse appearing at the output of comparator 105 (which is dependent on the reference waveform ramp rate), the conversion from duty cycle to output voltage at the output stage (which is dependent on the output stage supply voltage), and also possibly any gain or attenuation (not illustrated) in the feedback path or in the adder. The shape of the frequency response of the loop may be defined primarily by the loop filter. The loop filter will have a frequency response that typically provides reduced open-loop gain with increasing signal frequency. For example a simple first-order loop filter may provide a gain roll-off of the order of 20 dB per decade.

Figure 2:
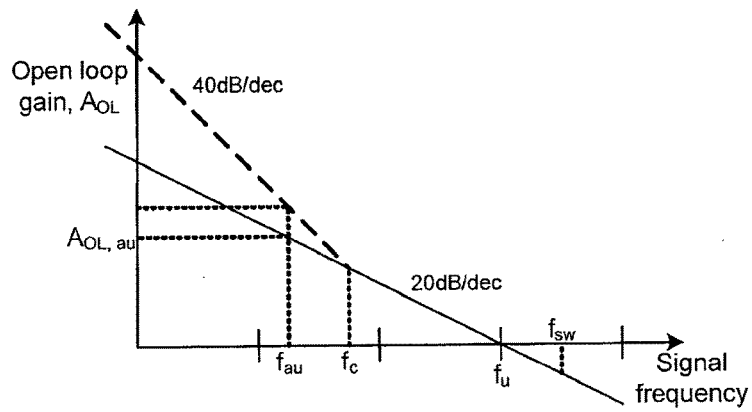
FIG. 2 illustrates the open-loop gain versus frequency response of the Class-D amplifier of FIG. 1.

FIG. 2 illustrates an example of the open-loop gain $A_{OL}$ versus frequency characteristic and illustrates (with the solid line) a gain roll-off of 20 dB/decade. If a certain level of open loop gain $A_{OL,au}$ is required at a given acoustic frequency, $f_{au}$, (e.g. 3 kHz say to attenuate the third harmonic of a 1 kHz signal) then this required open-loop gain will define the point of intercept, $f_u$, of the roll-off plot on the frequency axis. This frequency, $f_u$, corresponds to the unity gain frequency. To avoid instability in use, across the whole range of signal conditions, the switching frequency $f_{SW}$ of the amplifier should be at least a factor of $\pi$ greater than this value. For example, consider that the value of $f_u$ required was say 100 kHz: in this case the switching frequency $f_{SW}$ may be set to be at least 320 kHz and may be say 384 kHz, which is an integer multiple of a standard audio sample rate of 48 kHz.

Typically the loop filter response may be more complex and may for instance comprise a region with a second order slope of 40 db per decade as illustrated by the dotted line. This may provide increased loop gain at lower frequencies, and thus could potentially allow a lower value of $f_u$, but stability considerations require this region to end at a corner frequency $f_c$ which is at least an octave or so below $f_u$.

Conventionally therefore there is a minimum value which would be considered for the switching frequency of such a Class-D amplifier to ensure stability and thus a minimum to how low the $fCV^2$ losses could be.

In embodiments of the present invention however the switching frequency may be varied based on an indication of the input signal amplitude with the switching frequency being reduced at low signal amplitudes to reduce power losses.

Figure 3:
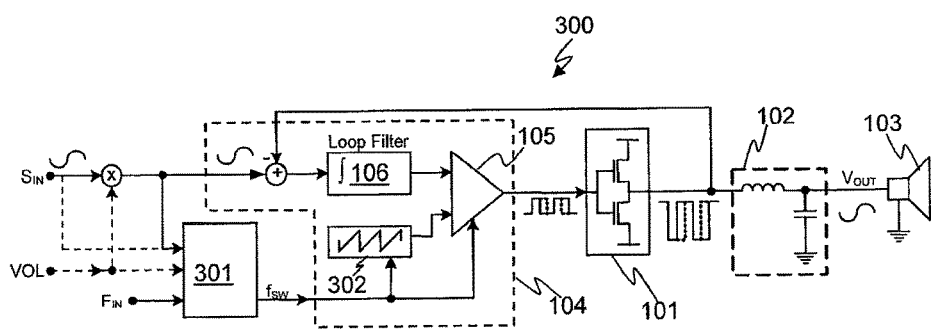
FIG. 3 illustrates a class-D amplifier circuit according to an embodiment of the invention.

FIG. 3 illustrates one example of an embodiment of the present invention. Similar components to those described above with reference to FIG. 1 are identified by the same reference numerals. In this embodiment however the PWM modulator 104 is supplied with a first clock signal with a frequency $f_{SW}$ that is variable based on an indication of the amplitude of the signal being amplified, i.e. an indication of the amplitude of the input signal, e.g. an actual or expected amplitude/envelope level of the input signal or an indication of the amplitude of the output signal.

The first clock signal may be supplied by a frequency controller 301 which controls the switching frequency $f_{SW}$ in response to a characteristic of the input signal $S_{IN}$ so as to provide a first switching frequency at a first input signal amplitude and a second, lower, switching frequency at a second, lower, input signal amplitude. The first clock signal is passed to a waveform generator 302 to generate the required reference waveform, e.g. a triangular waveform. The waveform generator 302 in FIG. 3 is different to the waveform generator 107 in FIG. 1 in that waveform generator 302 is configured to be able to operatively respond to changes in the first clock frequency $F_{IN}$ in real time during use. The frequency controller 301 operates such that at relatively high input signal amplitudes the switching frequency $f_{SW}$ is relatively high but for, at least some, relatively low signal amplitudes the switching frequency $f_{SW}$ is reduced so that power losses are reduced at low signal amplitudes.

It has been appreciated by the present inventors that the constraint that the switching frequency $f_{SW}$ of the Class D amplifier is greater than the unity gain frequency $f_u$ of the loop filter by a factor of at least u generally arises from a requirement that the slew rate of the filtered error signal does not exceed the ramp slope of the reference waveform. It has also been appreciated that when the input signal has a small amplitude the filtered error signal is smaller than when the input signal has a large amplitude. Thus the maximum slew rate of the filtered error signal is reduced and consequently a reduced slope of the reference waveform can be tolerated for low signal amplitudes. It has thus been appreciated that the switching frequency can be reduced at lower input signal amplitudes whilst still maintaining loop stability.

For a signal amplitude that reduces to zero, i.e. the quiescent signal condition with no input signal, the condition for loop stability drops to a requirement that the switching frequency be at least a factor of $\pi/2$ greater than the unity gain frequency.

Thus, in some embodiments, the switching frequency for small input signal amplitudes can be reduced by at least a factor of up to two (2) relative to the switching frequency for large input signal amplitudes. This can consequently reduce the power losses associated with switching, during moments of quiet in an audio track say, by up to a factor of two (2). In some embodiments, where the switching frequency for largest amplitude signals is greater than the required $\pi \cdot f_u$ it may be possible to reduce such switching frequency by a factor of more than two (2) for the lowest amplitude input signals.

It should be noted however that especially for Class-D amplifier circuits which do not comprise a filter 102 there may be an additional constraint that the switching frequency should be such that the spectrum of the output square wave, which is centred around $f_{SW}$, should fall in the inductive part of the load impedance—this is to avoid high frequency square waves of current flowing through the resistive components of the load which would lead to power dissipation and counteract any switching power efficiency savings. The switching frequency $f_{SW}$ should therefore be maintained well above the resistance/inductance corner frequency. For an example load (say 8 ohm resistance, 40 pH inductance) the corner frequency is around 30 kHz. The normal switching frequency for typical Class D amplifiers may typically be of the order of 384 kHz so this is not a significant constraint.

As mentioned the frequency controller 301 controllably varies the switching frequency based on an indication of the actual or expected input signal amplitude. In other words the frequency controller is responsive to a parameter which is related to the input signal amplitude. As illustrated in FIG. 3 the frequency controller may be arranged to monitor a characteristic related to the input signal and determine the envelope or amplitude of the input signal. Additionally, or alternatively, the frequency controller 301 may be arranged to receive a volume control signal, Vol. The volume control signal Vol may be used directly as an indication of the expected (maximum) input signal amplitude or used to modify an envelope value which is determined using the input signal prior to application of any volume controlled gain. In some embodiments the frequency controller 301 may receive an indication of the expected input signal amplitude as determined by some upstream circuitry (not illustrated). For instance, an upstream mp3 decoder may already compute or extract an indication of the amplitude of an envelope of the input signal. Also the host device, such as a mobile phone, may for example know whether the output is connected to a line-level load or to speakers or to more sensitive low-impedance headphone load with smaller permissible signal level.

Figure 4:
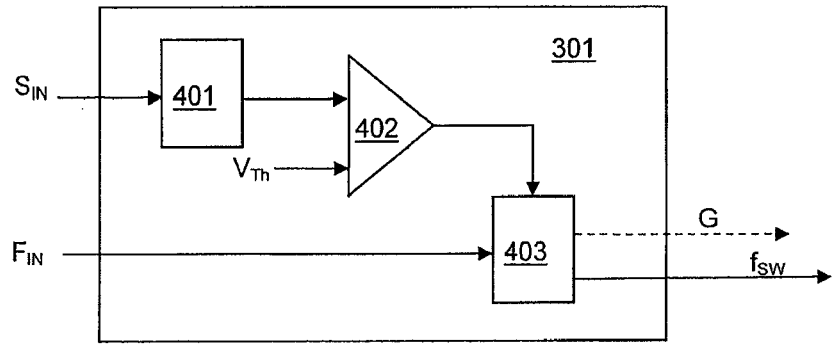
FIG. 4 illustrates one embodiment of a frequency controller.

FIG. 4 illustrates one embodiment of the frequency controller 301 of FIG. 3. In this embodiment a version of the input signal $S_{IN}$ is supplied to an envelope detector 401. The envelope detector 401 may be any conventional envelope/peak detector for determining the envelope of the input signal. The determined envelope value of the input signal is output to a comparator 402 where it is compared to at least a first threshold $V_{Th}$. The output of the comparator 402 is used to control a clock generator 403.

In one embodiment the frequency control circuitry 301 is configured such that an input signal amplitude above the first threshold $V_{Th}$ leads to a first switching frequency $f_{SW1}$ which is sufficient to ensure loop stability across the whole expected operating range of input signal amplitudes. The first switching frequency $f_{SW1}$ may be set to meet the criterion that it is greater than, or equal, to $\pi \cdot f_u$ where $f_u$ is the unity gain frequency for the loop filter. In some embodiments the first switching frequency $f_{SW1}$ may be set to be relatively close to a value of $\pi \cdot f_u$ so as to minimise switching losses at higher amplitude signals. In some embodiments however the first switching frequency $f_{SW1}$ may be set to a convenient value based on other existing system clocks.

If the input signal $S_{IN}$ amplitude is below the first threshold $V_{Th}$, a second, lower switching frequency $f_{SW2}$ may be used. The first threshold $V_{Th}$ may be set so as to correspond to very low input signal levels, for instance corresponding substantially to silence. In other words the frequency controller 301 may be arranged to use the second, lower, switching frequency $f_{SW2}$ for substantially quiescent input signal amplitudes but to use the first, faster, switching frequency $f_{SW1}$ for any input signal levels above a substantially quiescent level. In this case the second, slower, switching frequency $f_{SW2}$ may be of the order of about half of the first switching frequency $f_{SW1}$. In other embodiments however the first threshold $V_{Th}$ may be a given fraction of the maximum expected input signal amplitude, e.g. the threshold may be set at a level of say 10% or 20% or any desired fraction of the expected maximum input signal amplitude, for example the threshold may be set in the range of 5-25% of the maximum signal amplitude. Thus, the first switching frequency $f_{SW1}$ would be used for higher amplitude input signal levels and the second switching frequency $f_{SW2}$ would be used for lower input signal amplitudes.

In some embodiments there may be multiple thresholds associated with or corresponding to multiple different switching frequencies such that the switching frequency may be reduced in multiple steps if the input signal amplitude drops from a maximum level. In some embodiments the switching frequency may be varied in a substantially continuous manner with signal amplitude over at least a first range of signal amplitudes.

Advantageously the envelope detector 401 has a relatively fast attack time constant so as to react quickly to any increases in input signal amplitude to increase the switching frequency to a suitable level for the new input signal amplitude. It will be appreciated however that the filtered error signal will take some time to react to any increase in signal amplitude. The envelope detector may have a relatively slower decay time constant so as to delay response to any decrease in signal amplitude to avoid frequent changes of switching frequency. As will be explained in more detail later changing switching frequency can potentially lead to signal artefacts which could subsequently lead to audio artefacts in an audio application and thus it may be advantageous to avoid too many changes in switching frequency in a given period of time. The envelope detector 401 may therefore implement a hold period where the current envelope value is maintained for the hold period before being reduced, to delay any changes in switching frequency.

The clock generator 403 receives the output of comparator 402 and generates a clock signal with the appropriate switching frequency $f_{SW}$. The clock generator 403 may receive an input clock signal $F_{IN}$, which may be received from off chip or which may be generated from an on-chip oscillator in either case possibly via an on-chip frequency divider.

Figure 5:
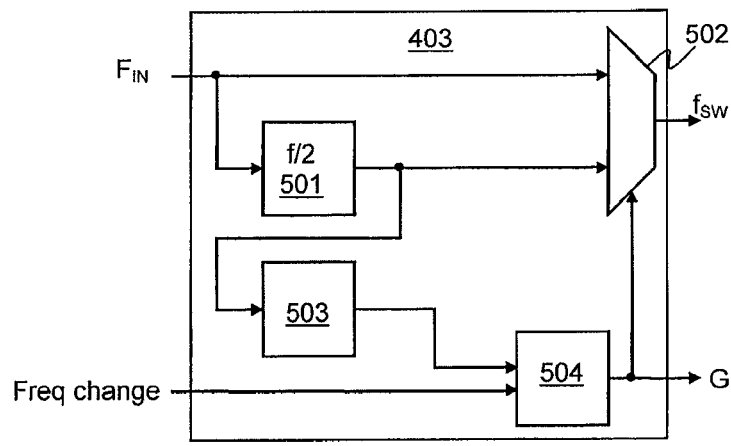
FIG. 5 illustrates one embodiment of a clock generator.

FIG. 5 illustrates one example of a clock generator circuit 403 for generating a clock signal at either a first switching frequency, $f_{SW1}$, or a second lower switching frequency $f_{SW2}$. The clock generator 403 receives the input clock signal $F_{IN}$ and generates at least one additional clock signal. In this embodiment the input clock signal $F_{IN}$ is passed to a frequency divider 501 and to one input of a multiplexer 502. The output of the frequency divider 501 is provided to the other input of the multiplexer 502. The output of the multiplexer 502 is the switching frequency clock signal $f_{SW}$. In this embodiment therefore the first switching frequency $f_{SW1}$ is equal to the frequency of the input clock signal $F_{IN}$ and the second switching frequency is a lower frequency as determined by the frequency divider. The frequency divider 501 may divide the input frequency by a factor of two so that the second switching frequency is half the frequency of the first switching frequency, i.e. $f_{SW2}=f_{SW1}/2$. It will be appreciated however that in other embodiments the input clock signal could be used to drive a frequency multiplier with the multiplied frequency being provided as one input to the multiplexer 502 as the first switching frequency and/or different ratios of frequency divider and/or multiplier could be used to provide different ratios between the first and second switching frequencies. Other switching frequencies could be also be generated and provided as inputs to a multiplexer to be selected as the output switching frequency.

The multiplexer output is controlled by a frequency change signal, for example the output from the comparator 402. Thus when the input signal envelope is above the first threshold the multiplexor output is the first switching frequency and when the input signal envelope is below the first threshold the multiplexor output is the second switching frequency.

The use of a frequency divider or multiplier in this way ensures that the first and second clock signals are synchronised. Advantageously any change in frequency is synchronised to an edge of the lower frequency signal, e.g. the second switching frequency clock signal in the case of a frequency divider, as this ensure that the change will be synchronised to a clock edge in both clock signals. This can ensure that the frequency change occurs at a maximum or minimum of the reference waveform which can be beneficial as will be explained in more detail below. Thus the output from the frequency divider may be input to an edge detector 503 which detects an edge of the clock pulse, say a rising edge (or alternatively a falling edge). The output of the edge detector 503 is used to synchronise the timing of any change in output of the multiplexor 502 to the clock edge of the lower frequency signal. In one embodiment therefore the output of the edge detector 503 and the frequency change signal may be inputs to logic 504. In one example logic 504 could for instance be a D-type flip-flop with the output of frequency divider 503 providing a clock for the flip-flop and the frequency change signal providing the data input.

The switching frequency clock signal is then provided to a waveform generator 302 to generate the reference waveform. The waveform generator may comprise an integrator circuit which is connected to current sources to charge during a positive part of the clock cycle and discharge during the negative part of the clock cycle. This results in a triangular waveform with a constant up and down slope and an overall cycle period defined by the clock signal.

It will be appreciated however that were such a waveform generator used with a variable frequency clock signal the amplitude of the reference waveform would also vary. Basically, with a constant ramp slope, if the period of the positive half of the clock cycle was doubled then the ramp excursion would also double. Ideally the amplitude of the reference waveform should be substantially the same before and after any change in switching frequency, otherwise the change in amplitude of the reference waveform would lead to a change in the conversion factor from loop filter output to duty-cycle, i.e. a change in open loop gain, which would lead to a transient in the output signal until the loop recovers to give the different loop filter output voltage necessary post-change to give a similar output duty-cycle.

Figure 6:
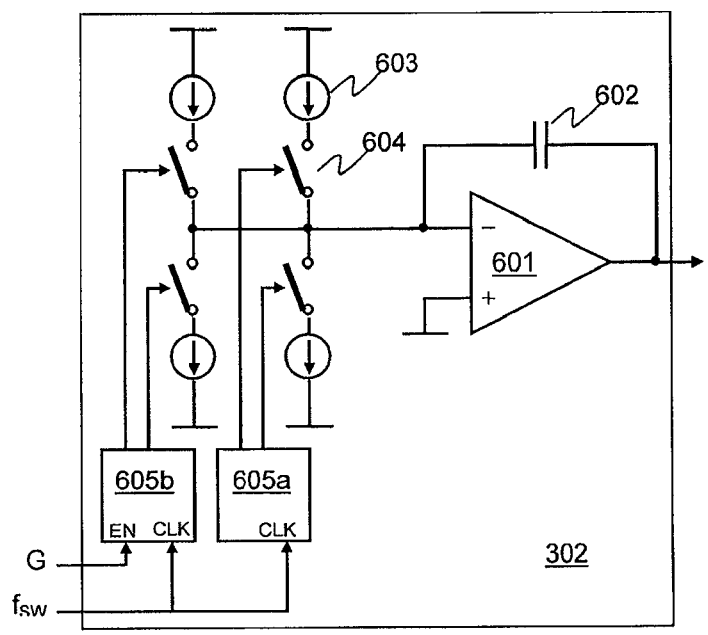
FIG. 6 illustrates one embodiment of a waveform generator.

FIG. 6 illustrates one embodiment of a waveform generator 302 that can maintain a constant amplitude reference waveform output on change in switching frequency. The waveform generator comprises an integrator circuit formed by op-amp 601 and feedback capacitor 602. Current sources 603 are connected to the input node of the integrator circuit by switches 604 to provide charging or discharging currents so as to generate positive or negative ramp slopes respectively. In the waveform generator illustrated in FIG. 6 there are two current steering branches. A first branch is controlled by current controller 605a and a second branch is controlled by current controller 605b. Both current controllers 605a and 605b receive the switching frequency clock signal and control the switches 603 in response to the control signal. However the second current controller can be enabled or disabled depending on the switching frequency.

Thus when the first, higher, switching frequency $f_{SW1}$ is used current controller 605b is enabled and thus the current at the input node of the integrator circuit is the sum of the current from both branches resulting in a given ramp slope. When however the second, lower, switching frequency $f_{SW2}$ is used the second branch current controller 605b is disabled so that only the first branch operates. Thus the current at the input node of the integrator is due to the first branch only and is reduced compared to the current when both branches are enabled, resulting in a reduced ramp slope. The relative contributions of the current sources of the various branches may be chosen with regard to the ratio of the first and second switching frequencies. For example when the second switch frequency is half the frequency of the first switching frequency the current sources of the first and second branches may generate substantially equal currents so the current when both branches are enabled is double that generated when the first branch only is enabled.

It will of course be appreciated that if there were more than two possible switching frequencies there may be more current sources that could be enabled or disabled to give a wider range of possible gains and/or programmable current sources could be used to provide a desired current output for a given switching frequency so as to provide a greater range of possible gains.

Figure 7:
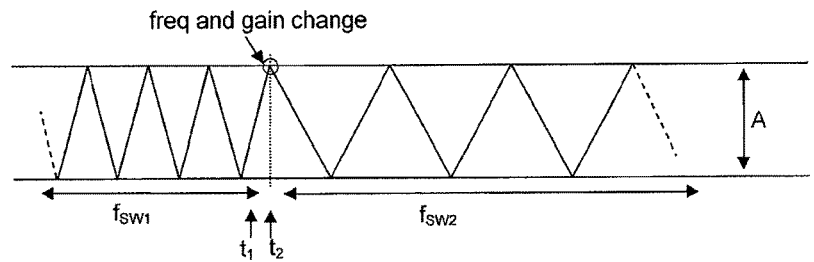
FIG. 7 illustrates the output of the voltage waveform generator illustrating how a change in switching frequency may be applied.

To allow the gain of the waveform generator to be set appropriately for the switching frequency, e.g. to enable or disable the second branch, the clock generator may output a gain control signal, G. In the embodiment of FIG. 5 this may conveniently comprise the signal which is used to control the output of the multiplexer. As was discussed above this signal is synchronised to the end of a positive or negative half-cycle of the frequency divided second switching frequency clock signal (and thus also synchronised to the end of a cycle of the first clock signal) and so the gain change, and the change in switching frequency, will occur at the switch from a positive ramp to a negative ramp or vice versa. This operation is illustrated in FIG. 7. FIG. 7 shows the output of the waveform generator 302 as a function of time. In a first period the waveform generator is generating a triangular waveform at a cycle frequency equal to $f_{SW1}$ and with the overall amplitude of the reference waveform being an amplitude A. At a time $t_1$ the input signal envelope value crosses the first threshold indicating a low amplitude input signal and the frequency change signal changes state. However it is only a time $t_2$ which is synchronised to an edge of the lower frequency clock signal that the frequency change is implemented. This corresponds to the maximum or minimum of the output of the reference ramp waveform (in this example a maximum). The switching frequency then changes to $f_{SW2}$ and thus the period of downramp is extended (doubled in this example). At the same time the gain of the waveform generator is changed (e.g. halved) so that the resultant amplitude of the output reference waveform is substantially unchanged.

This is advantageous as the change in switching frequency is not likely to occur at a point when the output stage is changing state. Typically a near 100% or near 0% duty cycle is rare and thus changing the switching frequency at the top or bottom of the reference waveform ramp avoids any issue with the output stage being switched as the switching frequency changes. In fact it will be understood that for small input signal levels the duty cycle will be near to 50% and thus switching will likely occur at the middle of each ramp.

In addition however it will be appreciated that at the point of change in switching frequency there will be a transient change in the duty cycle. As can be seen in FIG. 7 the duration of time that the reference waveform spends above any given amplitude level is different in the cycle preceding the frequency change, the cycle including the frequency change and also in the following cycle. This can lead to a transient in the output waveform which can, for audio applications, potentially result in an audible artefact such as a pop or click. It has been found that changing the switching frequency at the maximum or minimum of the reference waveform ramp results is preferable in terms of minimising the amount and/or effect of any such transient.

Figure 8A:
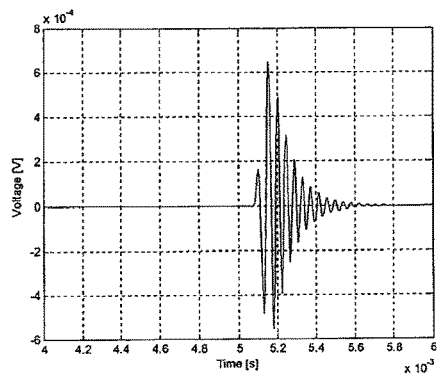
FIGS. 8a and 8b illustrate simulated voltage transients caused by a change in switching frequency.
Figure 8B:
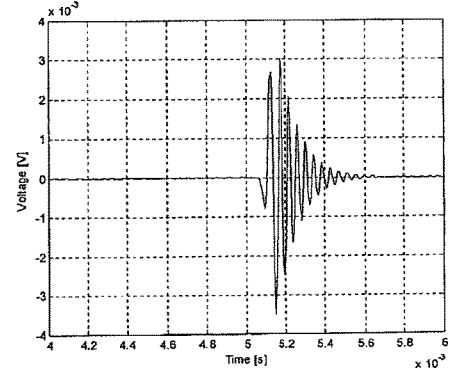

FIGS. 8a and 8b illustrate simulated voltage transients in a single-ended Class D amplifier with a sudden change in switching frequency applied. In this example a symmetric triangular waveform was used as the reference waveform and the switching frequency was changed from 384 kHz to 192 kHz, i.e. the second switching frequency was half the first switching frequency. FIG. 8a shows the simulated result with the switching frequency transition synchronised to the top of the voltage ramp, i.e. the timing of the change is the same as that shown in FIG. 7. FIG. 8b shows the simulated voltage transient when the change in frequency is applied at the zero crossing point of the voltage ramp, i.e. mid way through a voltage ramp. It can be seen that the duration of the voltage transient is similar in both cases but the peak-to-peak value of the transient shown in FIG. 8a (applied at the top of the voltage ramp) is about 1.1 mV whereas the peak-to-peak transient shown in FIG. 8b (change applied at zero crossing) is about 6.0 mV. The voltage transient occurring on an increase in switching frequency, from 192 kHz to 384 kHz was also modelled for both cases and showed similar results. It can therefore be seen that the noise transient that occurs when the frequency change is applied midway through the reference voltage ramp is thus at least 5 times greater than that which results from changing the frequency at the top of the voltage ramp.

The discussion above has focussed on a sudden change in switching frequency from the first switching frequency to the second switching frequency, or vice versa. As mentioned this can result in a voltage transient at the time of changing the switching frequency. In some embodiments the transition from the first switching frequency to the second switching frequency may therefore be implemented over a period of time, for instance in a series of steps or in a relatively continuous manner. Thus if the input signal amplitude falls below the first threshold say the switching frequency may be reduced from the first switching frequency to the second switching frequency over a period of time.

The switching frequency could therefore be varied from the first switching frequency to the second switching frequency in a substantially linear fashion with respect to time. It has been found however that to achieve the transition in a given timescale it may be better to implement a more gradual rate of change of switching frequency at the beginning and end of the transition and then increase the rate of change in the middle of the transition, for example to apply a type of sinusoidal rate of change of frequency.

Figure 9A:
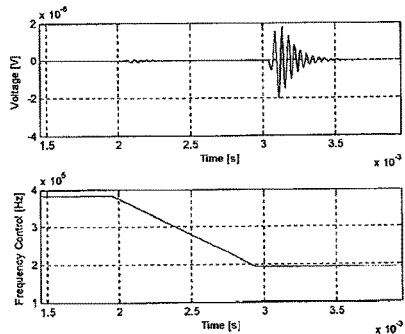
FIGS. 9a and 9b illustrate simulated voltage transients caused by a transition in switching frequency over a time period and FIG. 9c illustrates the resulting noise as a function of transition period.
Figure 9B:
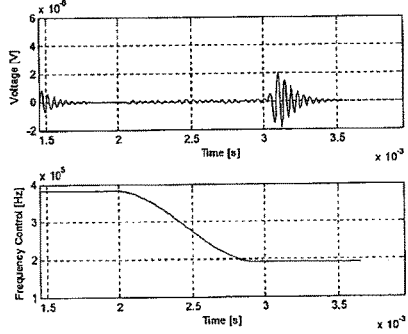

FIGS. 9a and 9b illustrate the simulated voltage transients for a change in frequency from a first higher switching frequency to the second lower switching frequency. In each figure the lower plot shows the variation in switching frequency against time from a first switching frequency of 384 kHz to a second switching frequency of 192 kHz over a period of about 1 ms. FIG. 9a illustrates a linear transition and FIG. 9b illustrates a sinusoidal type of transition with the rate of change of switching frequency starting low and then increasing before reducing again. The resultant voltage transient can be seen in the top plot of each figure.

Figure 9C:
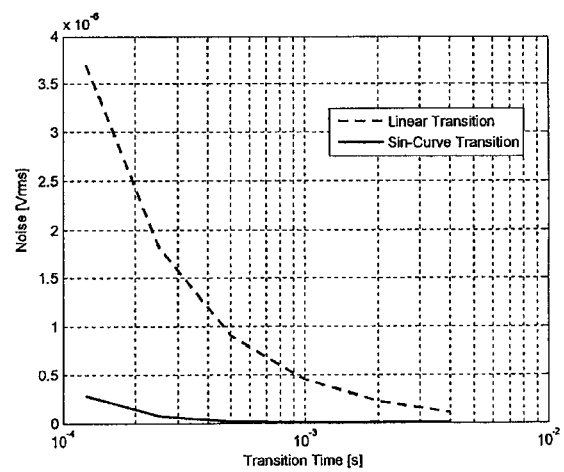

FIG. 9c illustrates the how the r.m.s. value of the noise transient varies with respect to transition period for both a linear change in switching frequency and also a sinusoidal change in switching frequency. It can be seen that for a given transition period that a sinusoidal type transition in switching frequency can lead to a lower voltage transient. Even with a relatively short transition period the voltage transient level can be reduced to microvolt levels with a sinusoidal type transition in switching frequency.

In order to provide a gradual change in switching frequency the waveform generator should be capable of generating waveforms with a plurality of different switching frequencies. As noted above however the amplitude of the reference voltage waveform should remain substantially the same so as to avoid any transient due to a change in loop gain.

Figure 10:
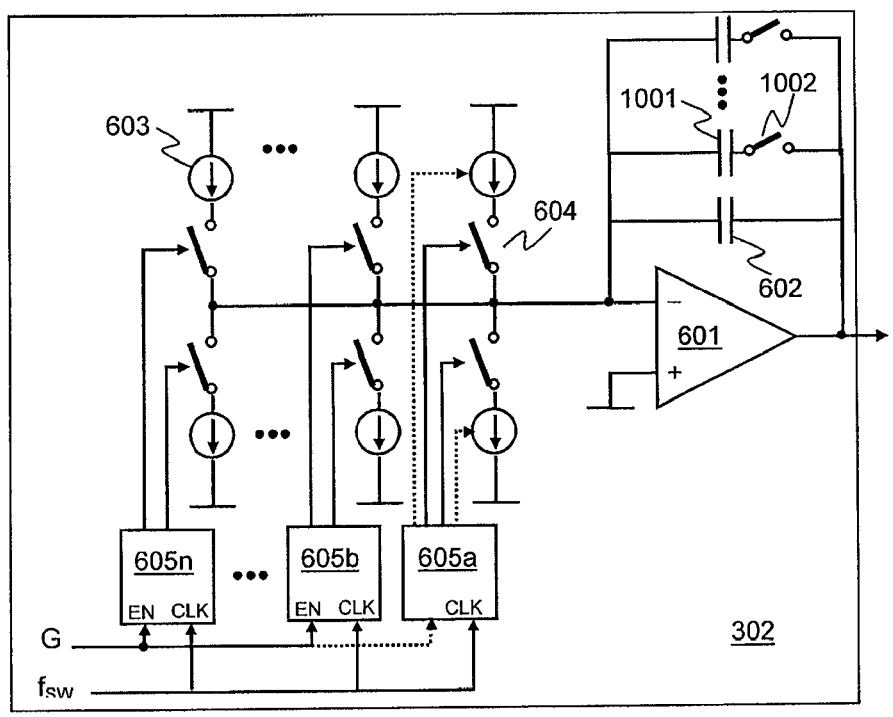
FIG. 10 illustrates another embodiment of a waveform generator.

FIG. 10 illustrates an embodiment of a waveform generator capable of operating at a plurality of different switching frequencies. The waveform generator of FIG. 10 is similar to that shown in FIG. 6 and similar components are identified by the same reference numerals. In the waveform generator of FIG. 10 there are more than two current steering branches each controlled by a respective current controller 605a to 605n. As described previous at least some of the current controllers may be enabled or disabled by the gain setting signal G so as to vary the gain of the waveform generator. In addition there are a plurality of additional feedback capacitors 1001 each which can be switched, via switches 1002, to be in parallel with feedback capacitor 602 to alter the feedback capacitance across op-amp 601 and thus vary the voltage ramp for a given current. Additionally or alternatively at least of the current sources may be programmable, for instance current controller 605a may receive the gain control signal and programme the output of the current sources of that branch accordingly.

The various components may be enabled/disabled or programmed as required so as to be operable with a range of different switching frequencies to provide an output reference waveform with substantially the same output amplitude.

In practice truly smooth, i.e. continuous switching frequency transition may however be difficult to achieve in such a circuit as there will be practical limits on the number of selectable components. In other words the waveform generator may only be able to operate to provide a constant amplitude reference waveform at a certain number of different switching frequencies and the resolution in these supported switching frequencies may not be good enough to provide a smooth transition in switching frequency.

In one embodiment therefore the clock signal input to waveform generator may be modulated by a sigma-delta modulator. The sigma-delta modulator may be responsive to a frequency control signal to provide a pseudo-smooth frequency change to the switching frequency clock signal. In other words the clock generator may comprise a sigma-delta modulator.

Figure 11:
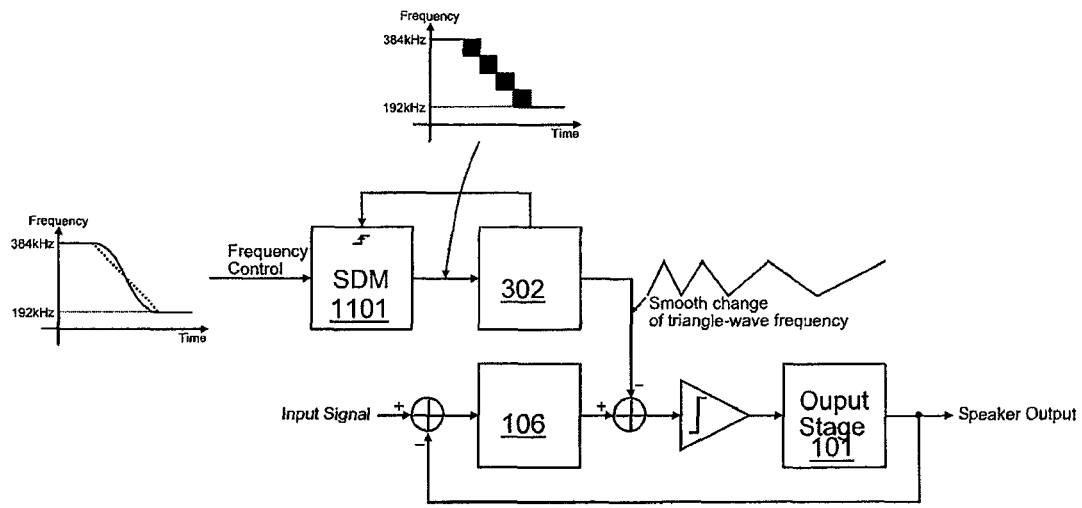
FIG. 11 illustrates an embodiment of the invention including a sigma-delta modulator for applying a variation in switching frequency.
Figure 12:
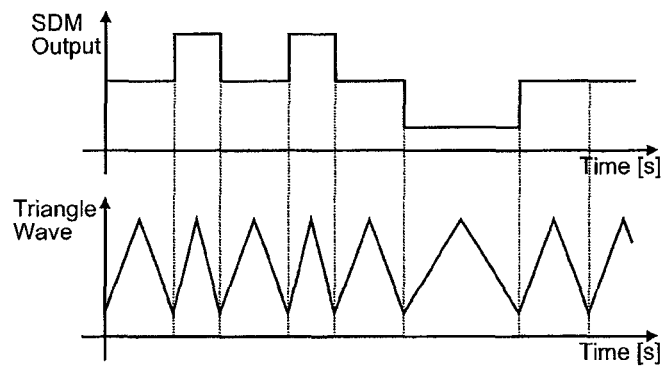
FIG. 12 illustrates how the output switching frequency of the sigma-delta modulator of FIG. 11 may vary.

FIG. 11 illustrates an embodiment of the invention having a sigma-delta modulator 1101. A switching frequency control signal is received by the sigma-delta modulator 1101. This switching frequency control signal may be controlled to provide a desired switching frequency transition, for instance a smooth decrease from a first switching frequency to a second switching frequency with a sinusoidal type transition. The sigma-delta modulator receives the input signal frequency and outputs a clock signal at one of a number of selected switching frequencies which are chosen such that the waveform generator 302 can operate at such a switching frequency and produce a reference waveform of constant amplitude. The sigma-delta modulator changes the switching frequency between these set levels based on the input signal frequency to approximate the required frequency transition. Again any changes in switching frequency may advantageously be timed to occur at the top or bottom of the ramp waveform produced by the waveform generator 302. FIG. 12 illustrates the output switching frequency of the sigma-delta modulator and illustrates how the output frequency is stepped up and down between predetermined switching frequencies to provide an overall pseudo-smooth variation in switching frequency with any changes in switching frequency being synchronised with the top, or in this case, the bottom of the voltage ramp.

Figure 13A:
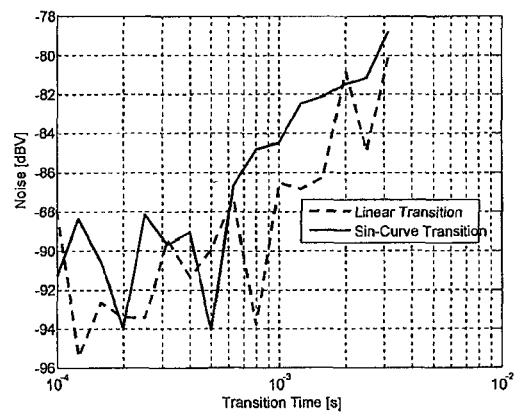
FIGS. 13a and 13b illustrates transient noise against period over which the frequency transition is implemented for an embodiment such as shown in FIG. 12 with different sigma-delta quantisation levels respectively.
Figure 13B:
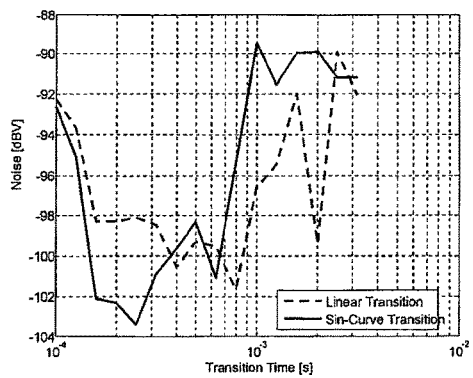

FIG. 13a illustrates the noise level, in dBV, generated as a result of a switching frequency transition as a function of transition time period using a four level sigma-delta modulator. FIG. 13a shows the results for a linear transition in switching frequency of the input to the sigma-delta modulator and also the results for a sinusoidal type frequency variation. FIG. 13b illustrates similar results but using a sixteen level sigma-delta modulator.

It can be seen that unlike the result for an ideal transition shown in FIG. 9c, the noise level does not continue to decrease with increasing transition time. This is due to the operation of the sigma-delta modulator which generates high frequency noise which itself causes noise at the output. Thus a longer transition time results in more overall noise for the sigma-delta modulator. Thus, in this case, there is a trade off between too short a transition time leading to increased noise from the voltage transient caused by a rapid change in switching frequency and too long a transition time increasing the overall noise generated by the sigma-delta. In these examples the optimum transmission time was around about 0.2-0.4 ms. Thus the transition period may be in the range of about 0.1 ms to 0.5 ms inclusive.

As can also be seen from FIGS. 13a and 13b increasing the number of quantization levels of the sigma-delta modulator can reduce the amount of noise generated during the transition. This would be expected. However it has been found that more than about 30 levels of quantization may not produce much additional benefit due to the noise inherently created by the sigma-delta modulator itself. It has also been found that the type of transition, e.g. linear or sinusoidal, is less significant in embodiments using a sigma-delta modulator as described.

In general then embodiments of the invention provide class-D amplifiers where the switching frequency of the output stage is reduced at relatively low input signal amplitudes so as to reduce switching power losses but without adversely impacting on loop stability. The change in switching frequency will result in a voltage transient which could lead to a signal artefact. For audio applications this could potentially lead to an audible artefact such as a pop or click. Implementing the change in switching frequency at the top or bottom of the reference ramp waveform can be advantageous in keeping the transient level relatively small and in some embodiments it can be beneficial to implement a transition gradually over a period of time, for instance by stepping through various intermediate switching frequencies. In some embodiments a pseudo smooth transition may be implemented through use of a sigma-delta modulator.

In some embodiments the frequency controller may receive an early warning of impeding silence in the audio signal, or a mute or power-down command, for instance from some upstream circuitry. This warning may be generated by a silence detector in the form of circuitry or signal processing operating on the incoming signal. The silence detector may be arranged to monitor the incoming signal before part of the signal path that includes some inherent processing delay or before some deliberately added delay to give long enough advance warning. Thus such a silence detector may be part of a Class-D amplifier according to an embodiment of the present invention. In such cases the frequency controller may implement a switching frequency reduction to a suitable low level before the audio input signal has reduced to zero amplitude (for instance over-riding any decay time constant or hold time implemented in normal operation) so that any transient occurs during the last period of audio content. Any transient is likely to be low and may be masked by any audio content in the input signal.

Figure 14:
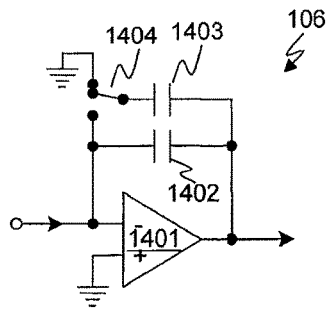
FIG. 14 illustrates an embodiment of a loop filter.

As discussed above, traditional stability analysis of a Class-D amplifier leads to a requirement that the switching frequency be at least a factor of $\pi$ greater than the open loop unity gain frequency. This condition may be relaxed to near a factor of $\pi/2$ for small signals. However, particularly for periods of silence or for small signals where there is less inherent distortion to be suppressed, a reduced loop gain-bandwidth may be adequate. Reducing the loop-gain bandwidth thus allows further possible reductions in the switching frequency and, as described above, it is desirable to run at a lower switching frequency. Thus in some embodiments as well as changing the switching frequency of the output stage the loop filter components may be programmable, so as to reduce the loop unity gain frequency or gain-bandwidth. For example as illustrated in FIG. 14 the loop filter 106 may be a simple integrator comprising an op-amp 1401 and a feedback capacitor 1402. At least one additional feedback capacitance 1403 may be selectively connected, by switch 1404, in parallel with capacitor 1402 to alter the feedback capacitance.

In cases where loop filter components may be switched in/out, switching may be configured to preserve the charge on capacitors. For example in the integrator of FIG. 14, when disconnected from the virtual earth, the capacitor 1403 remains connected to ground potential via switch 1404 and is then still charged and discharged in parallel with capacitor 1402, ready for re-connection to virtual earth to avoid transients due to charging the capacitors.

Figure 15:
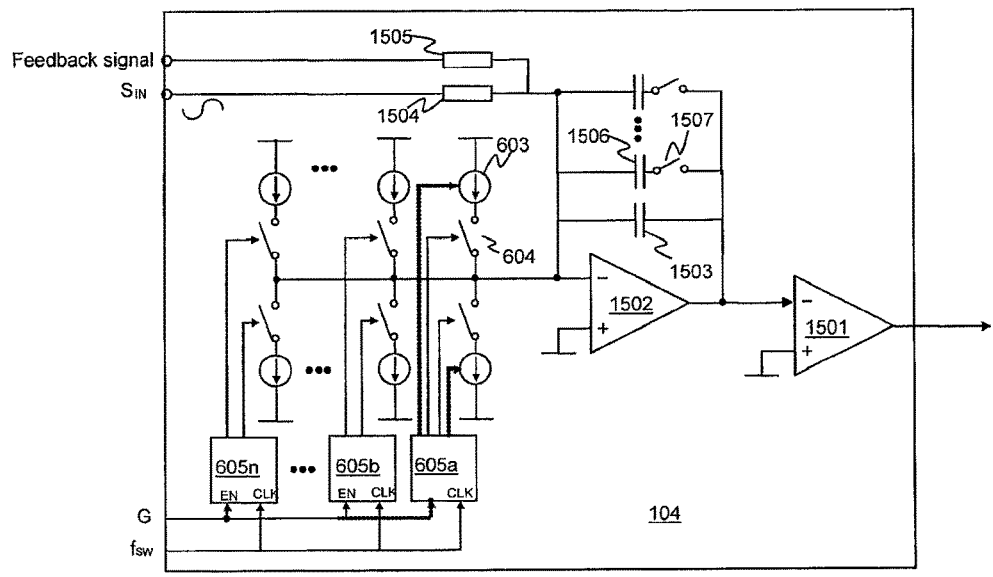
FIG. 15 illustrates an embodiment of a modulator for driving the output stage with a combined reference waveform generator and loop filter.

In some embodiments, the reference waveform generator, e.g. the sawtooth or triangle waveform generator, may be merged with parts of the loop filter. FIG. 15 illustrates an embodiment of modulator 104 for controlling the output stage 102 which combines elements of the reference waveform generator 302 and loop filter 106.

In the embodiment illustrated in FIG. 15 a comparator 1501 is arranged to output a PWM control signal that can be used to switch the output stage 102. Comparator 1501 is thus similar to comparator 105 described above but instead receives a single combined signal as one input, with the other input of comparator 1501 connected to some constant reference voltage, say ground. In this embodiment, the loop filter is an integrator comprising op amp 1502 and feedback capacitor 1503 fed by currents flowing through resistors 1504 and 1505 driven by the input signal Sin and the feedback signal from the output respectively. These currents are summed, but the signal path through the amplifier (e.g. the configuration of the logic driving the output stage) is adjusted so that the feedback signal appears with appropriate phase inversion.

To provide a triangle wave component of voltage at the output of the integrator, one or more current branches comprising current sources 603, may be arranged to the be switched to provide a square wave of current, i.e. alternate charging and discharging currents as described previously in relation to FIG. 10. The current controllers may, as described previously, control the current sources in response to the input clock signal $f_{SW}$.

In this embodiment therefore the current generated by the current sources 603 is integrated by the same integrator 1502, 1503 that forms part of the loop filter. this avoids the need for a separate feedback capacitor 602 and amplifier 601 of the alternative circuits of the triangle generators of FIG. 6 or 10.

To maintain the amplitude of the triangle output component when $f_{SW}$ is changed, the magnitude of this current may be changed by switching in more or fewer parallel current sources as described previously. Also the loop filter integrator time constant may be adjusted by adding in parallel integrator feedback capacitors 1506 via switches 1507. For example if the frequency of $f_{SW}$ is halved, doubling the feedback integrator capacitance will maintain the peak-to-peak swing of the triangle component and also halve the integrator bandwidth to help maintain stability.

In the embodiments described above the indication of the amplitude of the input signal may be derived from monitoring the received input signal (possibly after a user controlled volume gain is applied) or from a volume control signal or some other upstream signal. In other embodiments however the indication of the amplitude of the input signal may be derived at least in part from other parts of the signal chain within the Class-D amplifier circuitry and used to alter the switching frequency accordingly. For instance the control signals output from the modulator 104 are used to control the switches of the output stage so as to provide an amplified version of the input signal and thus can be used to indicate the amplitude or envelope of the input signal, for example by indicating the duty cycle. Likewise the output voltage from the output stage can be used, either before filtering by looking at the duty cycle or after filtering by comparison to a reference voltage. It will be understood therefore that the indication of amplitude of the input signal can be derived from a signal produced within the class-D amplifier circuit whose properties depend on the input signal.

Figure 16:
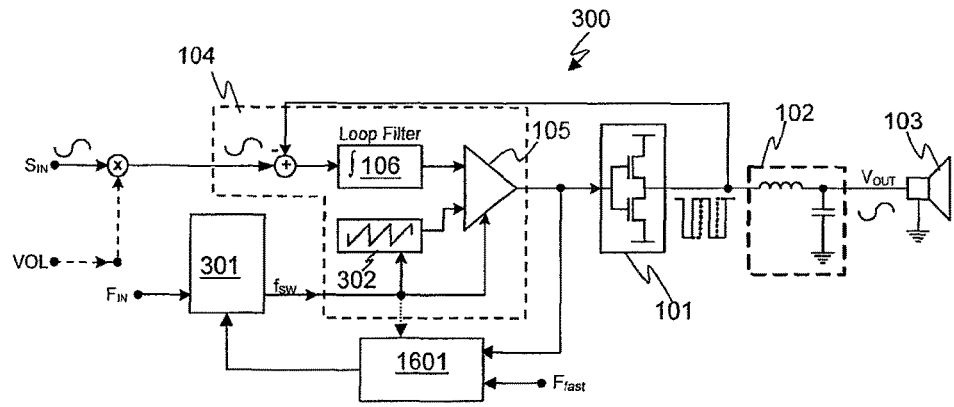
FIG. 16 illustrates a further embodiment of a Class D amplifier circuit.

FIG. 16 illustrates a Class-D amplifier according to an embodiment of the invention (where similar components to those described above with reference to FIG. 3 are identified with the same reference numerals) where the output pulse from comparator 105 is monitored, and the switching frequency selected based on the duty cycle or pulse width observed. This pulse width or duty cycle may be observed, for example, by means of a counter 1601 clocked by a fast clock $F_{fast}$. The frequency of $F_{fast}$ should be sufficient to allow the pulse width or duty cycle to be determined with sufficient precision at the fastest switching frequency of the amplifier and may be say about 64 times the normal switching frequency (about 24 MHz for $f_{SW}$=384 kHz) or even faster. In some embodiments the fast clock $F_{fast}$ may be a clock signal that is already present in the system, for example to provide a clock for digital signal processing circuitry.

The counter may, in one embodiment, be configured to start counting on the positive edge of the output from comparator 105 and stop counting on the negative edge to give a measure of the pulse width in terms of cycles of the clock $F_{fast}$. The count value output from counter 1601 may be compared directly and immediately with some threshold value or set of threshold values, to decide what switching frequency to use. It will of course be appreciated that the expected pulse width output from comparator 105 will change along with a change in switching frequency $f_{SW}$ although the duty cycle should remain the same (apart from the slight artefacts discussed above arising as the switching frequency is changed). The frequency controller 301 may therefore apply a different threshold depending on the present switching frequency (and the counter 1601 may be clocked by the clock signal produced by the frequency controller). For example consider that the switching frequency is a first, relatively fast, switching frequency $f_{SW1}$ and the fast clock signal is $64f_{SW1}$. A relatively low amplitude signal would lead to a near 50% duty cycle and thus a count value near to 32 over the switching cycle. The frequency controller may therefore be configured such that, when operating at $f_{SW1}$, to reduce the switching frequency if the count value is within a set range, e.g. say within a count range of 24 to 40 or 28 to 36. If a count value in the relevant range is produced the frequency controller may change (possibly via a gradual transition as discussed above) to a second, slower switching frequency $f_{SW2}$, which may for instance be $0.5f_{SW1}$. At such a second switching frequency a duty cycle of 50% would lead to a pulse width equal to 64 periods of the fast clock signal $F_{fast}$. When the switching frequency is changed the relevant thresholds for switching back to the first switching frequency may be changed to count values of say 48 to 80 or 56 to 72.

In other embodiments however an up-down counter may be used to count up during the positive part of the pulse output from comparator 105 and count down during the negative part of the pulse to provide an overall indication of the duty cycle which could be compared to thresholds. Alternatively the frequency of the fast clock signal could be varied in accordance with frequency changes to the switching frequency.

The frequency controller 301 may be configured to apply a hold time or hysteresis to prevent too frequent changes in switching frequency in a similar fashion as described above.

Embodiments that use, e.g. counters, for determining the pulse width or duty cycle of the drive signals for the output stage provide a method of controlling switching frequency using a small amount of purely digital hardware. This is especially advantageous in the case of a system with analogue inputs and thus no digital representation of the input signal, or for amplifiers on small geometry manufacturing processes.

Other embodiments may take the output signal, either direct from the output stage, possibly with some filtering, or after the post filter and derive an envelope thereof for processing similar to that describe for processing an input signal to provide a signal to control $f_{sw}$.

The analogue output signal may be passed through an ADC, to allow the signal processing to be performed digitally. Preferably such an ADC would be a continuous-time ADC, i.e. one which does not sample its input signal, to allow accurate capturing of the duty cycle and any transients arising around switching edges without having to run at an excessive sampling frequency. Such ADCs include continuous time delta-sigma converters and converters including voltage-to-frequency converters or voltage-controlled oscillators.

The embodiments described above have mainly been described in terms of a half bridge output stage but, as mentioned above, embodiments of the invention may be readily adapted and implemented with a full H-bridge output stage. Use of a full H-bridge output may help suppress any transient across the load.

Figure 17A:
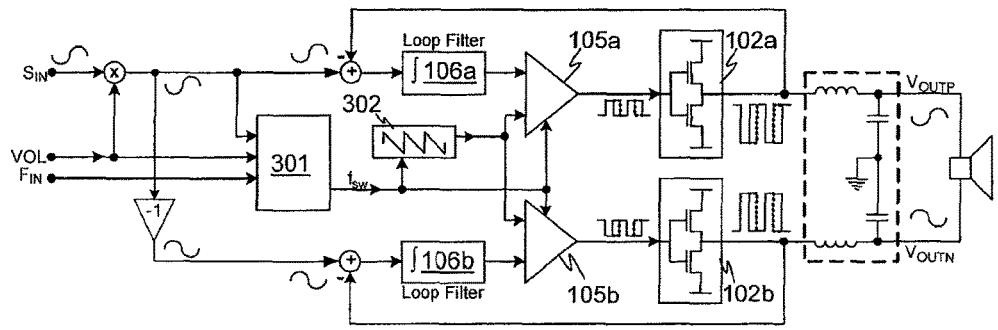
FIGS. 17a and 17b illustrate two embodiments of Class D amplifier circuits with full bridge output stages.

A full H-bridge output Class-D amplifier may be constructed simply from two circuits similar to that of FIG. 3, with preferably a shared control and common $f_{sw}$ as illustrated in FIG. 17a. Such an embodiment can be seen as having an output stage formed by first half bridge 102a and second half bridge 102b each driven by its own comparator 105a and 105b respectively. Comparator 105a receives an error signal, filtered by loop filter 106, which is derived from the input signal and the voltage at the output node of half bridge 102a. Comparator 105b receives an error signal, filtered by loop filter 106, which is derived from the inverse of the input signal and the voltage at the output node of half bridge 102b. Both comparators compare the error signal with a reference waveform produced by generator 302, which runs at a switching frequency controlled by frequency controller 301.

Figure 17B:
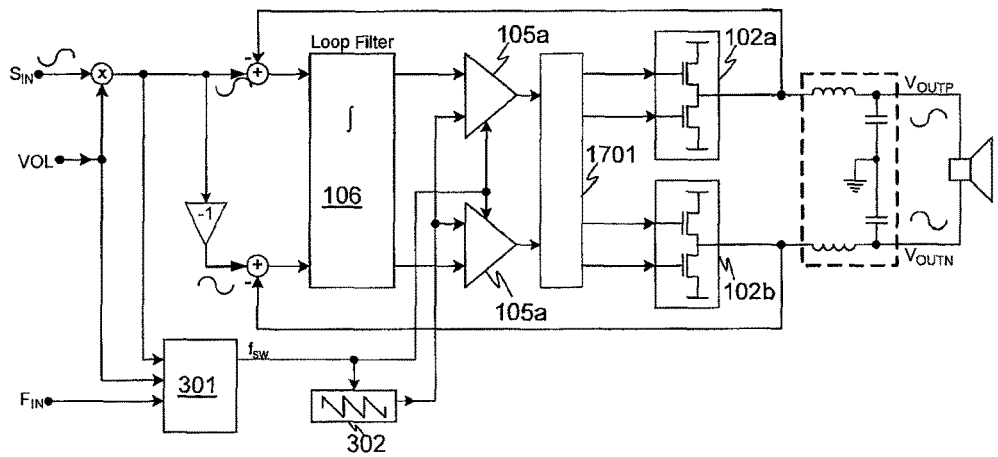

Alternatively a fully-differential architecture may be employed as in FIG. 17b, This may include logic 1701 as shown, to drive the four output transistor independently to allow three or four output states including states where both outputs may be switched in the same polarity to give zero differential voltage across the load in some clock cycles, reducing EMI issues and the requirements for any post-filtering.

In some embodiments there may be no feedback path from the output to the modulator, as in known open loop Class D amplifiers, but the switching frequency is still reduced for low input signals by means of a frequency controller similar to that described. Such open loop embodiments may comprise substantially digital circuitry for the modulator.

As mentioned above therefore in general embodiments of the invention relate to Class-D amplifier circuits having an output stage and controller for controlling switching of the output stage to amplify a signal wherein the controller is configured to switch the output stage with a first switching frequency at a first signal amplitude and with a second, lower, switching frequency at a second, lower, signal amplitude. The switching frequency is thus controlled in the response to an indication of the amplitude of the signal being amplified. The controller is configured to reduce the switching frequency of the output stage for low amplitude signals. The amplifier may therefore have a a modulator with a signal input for receiving a signal and a clock input for receiving a first clock signal, the modulator being configured to control the duty cycles of the switches of the output stage based on the input signal and a cyclic reference waveform, wherein the frequency of said cyclic reference waveform depends on said first clock signal; and a frequency controller controls the frequency of the first clock signal to provide a first frequency at a first signal amplitude and a second, lower, frequency at a second, lower, signal amplitude.

The amplifier circuit may advantageously be used to amplify audio input signals for instance as part of an audio driving circuit or audio signal processing circuit. However embodiments of the invention may be implemented to amplify a range of different input signals for a variety of applications.

The amplifier circuit may conveniently be implemented as an integrated circuit and may form part of a host electronic device, especially a portable device and/or a battery powered device. The amplifier may be used in an audio device such as a personal music or video player. The amplifier may be implemented in a mobile communications device such as mobile telephone or a computing device, such as a laptop or tablet computer or PDA. The amplifier may be used in a gaming device. The amplifier may be used in device having an ultrasonic transducer or a haptic transducer.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

What is claimed is:

1. A Class-D amplifier circuit for amplifying an input signal comprising:
   an output stage comprising at least first and second switches;
   a modulator comprising a signal input for receiving said input signal and a clock input for receiving a first clock signal, the modulator being configured to generate a switch control signal to control the duty cycles of said first and second switches within a switching cycle based on said input signal and to output the switch control signal to the output stage, wherein said switching cycle has a switching frequency based on said first clock signal; and
   a frequency controller configured to receive a version of the switch control signal output from the modulator and to control the frequency of said first clock signal based on said received switch control signal.

2. A Class-D amplifier circuit as claimed in claim 1 wherein the frequency controller is configured to control the frequency of said first clock signal so as to provide a first switching frequency at a first value of duty cycle of said first and second switches and a second switching frequency at a second value of duty cycle of said first and second switches, wherein said second value of duty cycle corresponds to a lower output signal amplitude than said first value of duty cycle and wherein the second switching frequency is lower than the first switching frequency.

3. A Class-D amplifier circuit as claimed in claim 1 wherein the frequency controller is configured to monitor the switch control signal and control the frequency of said first clock signal based on a determined pulse width or duty cycle of pulses in the switch control signal.

4. A Class-D amplifier circuit as claimed in claim 3 wherein the comprise a counter configured to produce a count value for each switching cycle corresponding to pulse width or duty cycle of pulses in the switch control signal, the counter being clocked by a second clock signal wherein the second clock signal has a greater frequency than said first clock signal.

5. A Class-D amplifier circuit as claimed in claim 4 wherein the second clock signal has a frequency which is at least 64 times greater than a maximum frequency of the first clock signal.

6. A Class-D amplifier circuit as claimed in claim 4 wherein the frequency controller is configured to compare the count value to a count threshold to determine the switching frequency of the first clock signal.

7. A Class-D amplifier circuit as claimed in claim 6 wherein the count threshold depends on the then present switching frequency of the first clock signal.

8. A Class-D amplifier circuit as claimed in claim 6 wherein the frequency of the second clock signal varies in accordance with frequency changes to the first clock signal.

9. A Class-D amplifier circuit as claimed in claim 6 wherein the counter is configured to start counting at the beginning of a control pulse and stop counting at the end of a control pulse such that the count value corresponds to the temporal width of the control pulse.

10. A Class-D amplifier circuit as claimed in claim 6 wherein the counter is an up-down counter configured to increment for part of the switching cycle and decrement for the rest of the switching cycle based on the duration of the control pulse such that the count value corresponds to a difference in variation of the duty cycle from 50%.

11. A class-D amplifier as claimed in claim 1 wherein said modulator comprises a reference waveform generator for generating a ramped reference waveform at a frequency based on said first clock signal and a comparator for comparing a first signal derived from the input signal with the ramped reference waveform to generate said switch control signal.

12. A class-D amplifier as claimed in claim 11 wherein said frequency controller is configured such that any change in switching frequency is substantially synchronised to the top or bottom of the ramp of the reference voltage waveform.

13. A class-D amplifier as claimed in claim 11 wherein said reference waveform generator is configured such that the amplitude of the reference waveform is substantially the same at said first and second switching frequencies.

14. A class-D amplifier as claimed in claim 13 wherein said frequency controller is configure to generate a gain control signal indicating any changes in said switching frequency and the reference waveform generator is configured to receive the gain control signal and adjust the slope of the ramp waveform based on said gain control signal to compensate for any change in switching frequency.

15. A class-D amplifier as claimed in claim 1 wherein said frequency controller is configured to implement the transition from the first switching frequency to the second switching frequency or the second switching frequency to from the first switching frequency over a period of time.

16. A driver circuit comprising a class-D amplifier circuit as claimed in claim 1 wherein said driver circuit is arranged to drive at least one of: an audio transducer, a haptic transducer, an ultrasound transducer; or an electromechanical actuator or motor.

17. An electronic device comprising a class-D amplifier as claimed in claim 1 wherein the device is at least one of: a portable device; a battery powered device; a mobile communications device; a computing device; a gaming device; an audio device; or an ultrasonic device.

18. A Class-D amplifier circuit for amplifying an input signal comprising:
   an output stage comprising at least first and second switches;
   a modulator comprising a signal input for receiving said input signal and a clock input for receiving a first clock signal, the modulator being configured to control the duty cycles of said first and second switches within a switching cycle based on said input signal, wherein said switching cycle has a switching frequency based on said first clock signal; and a frequency controller configured to determine the duty cycle of the first or second switches and to control the frequency of said first clock signal based on the determined duty cycle of the first or second switches.

19. A Class-D amplifier circuit for amplifying an audio signal comprising:
an output stage comprising at least first and second switches;
a modulator comprising a signal input for receiving said audio signal and a clock input for receiving a first clock signal, the modulator being configured to generate a PWM control signal to control the duty cycles of said first and second switches based on said audio signal and a cyclic reference waveform and output the PWM control signal to the output stage, wherein the frequency of said cyclic reference waveform depends on said first clock signal; and
a frequency controller configured to receive the PWM control signal output from the modulator and to control the frequency of said first clock signal based on the received PWM control signal.

20. A Class-D amplifier circuit as claimed in claim 19 wherein the frequency controller is configured to control the frequency of said first clock signal based on the duty cycle of said PWM control signal.

\* \* \* \* \*